United States Patent [19]
Selby

[11] Patent Number: 4,940,108
[45] Date of Patent: Jul. 10, 1990

[54] OPEN LINE SOURCE SPEAKER SYSTEM

[76] Inventor: John L. Selby, 1206 Perryville Rd., Cape Girardeau, Mo. 63701

[21] Appl. No.: 314,807

[22] Filed: Feb. 24, 1989

[51] Int. Cl.[5] .................................................. H05K 5/00
[52] U.S. Cl. ...................................... 181/145; 181/147; 181/199; 381/24; 381/90; 381/184; 381/186; 381/205
[58] Field of Search .................................... 181/144–147, 181/156, 199; 381/24, 89, 90, 159, 182, 184, 186, 205

[56] References Cited

U.S. PATENT DOCUMENTS

| | | | |
|---|---|---|---|
| 2,632,055 | 3/1953 | Parker | 381/90 |
| 3,241,631 | 3/1966 | Manieri | 181/147 |
| 3,308,237 | 3/1967 | Novak | 381/98 |
| 4,031,318 | 6/1977 | Pitre | 181/145 X |
| 4,042,778 | 8/1977 | Clinton | 381/182 |
| 4,054,750 | 10/1977 | Montgomery et al. | 181/147 X |
| 4,181,819 | 1/1980 | Cammack | 381/90 |
| 4,223,760 | 9/1980 | LeTourneau | 181/147 |
| 4,289,929 | 9/1981 | Hathaway | 181/147 X |
| 4,399,328 | 8/1983 | Franssen | 181/144 X |
| 4,653,606 | 3/1987 | Flanagan | 181/145 |
| 4,757,544 | 7/1988 | Guy | 381/90 |

FOREIGN PATENT DOCUMENTS

| | | | |
|---|---|---|---|
| 1527032 | 5/1968 | France | 181/156 |

*Primary Examiner*—Benjamin R. Fuller
*Attorney, Agent, or Firm*—Rogers, Howell & Haferkamp

[57] ABSTRACT

An open line source speaker system includes a first columnar cabinet enclosing a plurality of midrange or woofer speakers arranged in the cabinet in a vertical line and a second columnar cabinet enclosing a plurality of tweeters arranged in the cabinet in a vertical line, with the first and second cabinets being spaced a predetermined distance from each other by a pair of spacing elements and the base portion of the speaker system supporting the first and second cabinets. The vertical height of the speakers will be such as to offer a large listening window of approximately floor height to well above the listener's head. All frequencies of the music originate from the same plane as positioned from the listener thus maintaining correct time/phase relationship and correct stereo image in both the horizontal and vertical planes regardless of musical frequency. Each column is constructed as to minimize early reflections, therefore is either baffleless in the case of the tweeter column, or absolute minimum, which is the case of the midrange or woofer column.

22 Claims, 2 Drawing Sheets

OPEN LINE SOURCE SPEAKER SYSTEM

BACKGROUND OF THE INVENTION (1) Field of the Invention

The present invention relates to stereo loudspeaker designs, and more particularly to columnar loudspeaker cabinets enclosing vertical arrays of speakers that produce accurate stereo sound imaging in both vertical and horizontal planes.

(2) Description of the Related Art

Systems for stereophonic sound production typically may include two sound sources, each comprising one or more speakers mounted in an enclosure. Conventionally, speaker enclosures have limited vertical height. The vertical height of the source enclosure limits the vertical height of the sound produced by the speakers of the enclosure. This, in turn, limits the vertical height of the stereo sound image produced by the two sound sources. For example, in listening to a stereo reproduction of an orchestral performance, most speakers create a realistic impression of the stage width of the live performance by horizontally spacing the reproduced sounds of different musical instruments. However, the limited vertical height of the speaker enclosures prevents an accurate recreation of the actual vertical height of the instruments on the stage during the live performance. The true benefit of the present speaker is the perceived height of the live performance spread across a soundstage of impressive height.

The cabinet enclosure construction may also be detrimental to the quality of the stereo sound image produced by the sources. Speakers are commonly mounted in the cabinet enclosures in a recessed position in the face of the cabinet, commonly called a baffle. The mounting of the speakers in the cabinet may expose portions of the cabinet structure to the path of travel of sound waves produced by the speakers. The sound waves produced by the speakers will reflect off any obstructions in their path. (See U.S. Pat. No. 4,289,929). These early reflections of the sound waves or secondary waves cause two problems. They interfere with the primary sound waves produced by the speakers, causing cancellation of some sound frequencies and exaggeration of others, so that the sound heard by the listener is not a true reproduction, but a colorized reproduction influenced by the secondary waves. Secondly, the stereo sound image is produced by sound wave time domain differences. The secondary sound waves produced by the early reflections of the primary sound waves do not have the same time domain difference of the primary sound waves. This reduces the ability of the speakers to reproduce an accurate stereo image and results in a lack of focus of the stereo sound image produced. Producing the sound waves in a correct time domain relation produces a life-like stereo image.

One type of prior art speaker arrangement is illustrated in U.S. Pat. No. 4,653,606 wherein the speakers are arranged both vertically and horizontally. However, this arrangement does not take into account the vertical placement of various sounds and is lacking in the height quality obtained by the present invention. Also the line source speakers of this type are lacking in the bass region. The arrangement obtains a prescribed directional response pattern by operating each of the different driver elements individually through specific frequency ranges, and all of the drivers are not operated through the full range of frequencies.

The present invention obtains vertical height reproduction of all instruments. It operates as a true line source through all frequencies of the music, by emitting sound through all frequencies, top to bottom.

Another type of speaker employed heretofore had individual drivers staggered at varying depths in relation to their voice coil position, and also a prior art baffleless design. This could be illustrated by the Dalquist speakers. This type of speaker, with minimum baffles, did eliminate baffle related problems such as the early reflections from the baffles of secondary waves that interfere with the primary waves causing cancellation of some frequencies and exaggeration of others, and the reflections from the baffles of secondary waves that are not in the same time domain as the primary waves, causing a lack of focus and a slight phase shift of the stereo image. This type of speaker arrangement had an extremely narrow sweet spot, little vertical height, very low efficiency and low bass output.

A type of speaker system that is similar to the Dalquist design is disclosed in U.S. Pat. No. 4,289,929. This type of speaker design also eliminated the baffle related problem of secondary or standing sound waves that resulted in "phantom drivers" producing sound other than what comes from the driver itself. However, this design provided only a single driver in a baffleless situation and was not a true line source.

Other prior art speaker systems include long vertical columns of tweeters with separate relatively low mountings of bass or woofer speakers. This is illustrated by the McIntosh speaker, with 23 tweeter elements mounted in a manner to provide a baffle arrangement with a consequent distortion. Although this design provides an improvement in vertical height over other designs, it still uses a baffle surrounding the tweeter arrays, has unimpressive vertical height, and the high frequency range of the speaker is the only part of the music reproduced as a line source configuration.

The present invention seeks to overcome these shortcomings of conventional loudspeaker systems.

It is therefore an object of the present invention to provide an improved loudspeaker system that produces a stereo sound image in both a horizontal plane and an extended vertical plane, while avoiding a reduction in the quality of the stereo sound image produced due to early reflections of sound waves.

SUMMARY OF THE INVENTION

The applicant's arrangement comprises two separate columns of speakers. One column has only identical tweeter loudspeakers and the other column has only identical woofer loudspeakers or identical midrange loudspeakers. The two columns are secured together but spaced apart by enough distance to prevent interference between them. Both columns face forward. Both are at least about 5½ feet high so as to preferably provide for sound emissions in a plane above the listener. The speakers extend almost to the floor. And the preferred arrangement will be six or more serially spaced speakers in each column.

The midrange or woofer column is made as narrow as possible to avoid interference of the sound waves emitted by the midrange or woofer speakers from portions of the speaker enclosure. The column is also made deep enough to allow for sufficient internal volume to permit good bass performance of the speakers. The physical depth of the speaker column also provides sufficient volume for the placement of a sub-bass (passive) radiator in the sides of the column should one be desired.

A separate second column is provided for the tweeter speaker assemblies. The speakers are arranged in a vertical line and mounted in the face of the second column. The tweeters are vertically spaced in the second column to line up horizontally with the midrange or woofer drivers in the first column. The tweeter column is also made as narrow as possible to prevent portions of the tweeter column enclosure from interfering with the sound waves produced by the tweeters. The vertical space between adjacent tweeters is left open to reduce the surface area that could cause early reflections of the sound waves. The tweeter column is fixed at a predetermined distance from the woofer column to provide a correct phase relationship between the sound waves produced by the woofer column and the tweeter column.

The twin column design of the open line source speaker system, with the extended vertical height of both columns, is less sensitive to changes in listener position. The vertical height of the system creates a more realistic and accurate reproduction of sound that gives the listener the impression of a live performance spread across a soundstage of impressive height.

BRIEF DESCRIPTION OF THE DRAWINGS

Further objects and features of the present invention are revealed in the following description of the preferred embodiment and the drawing FIGURES wherein.

DESCRIPTION OF THE PREFERRED EMBODIMENT

Figure 1:
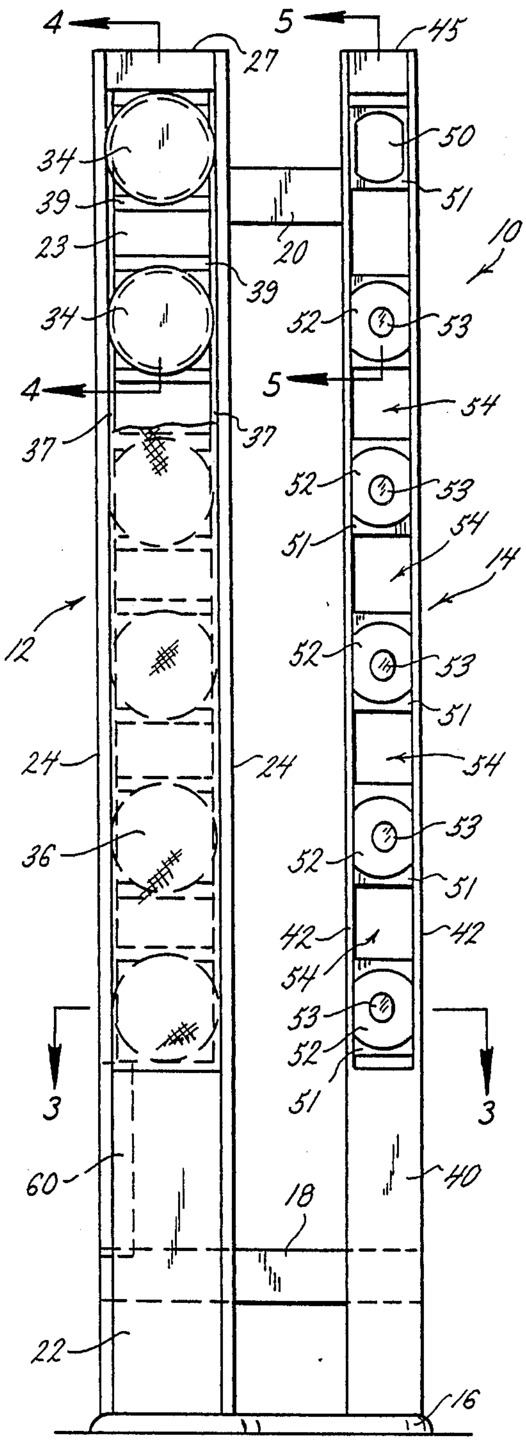
FIG. 1 is an elevation view of the two vertical column speaker mounts of the open line source speaker system.
Figure 2:
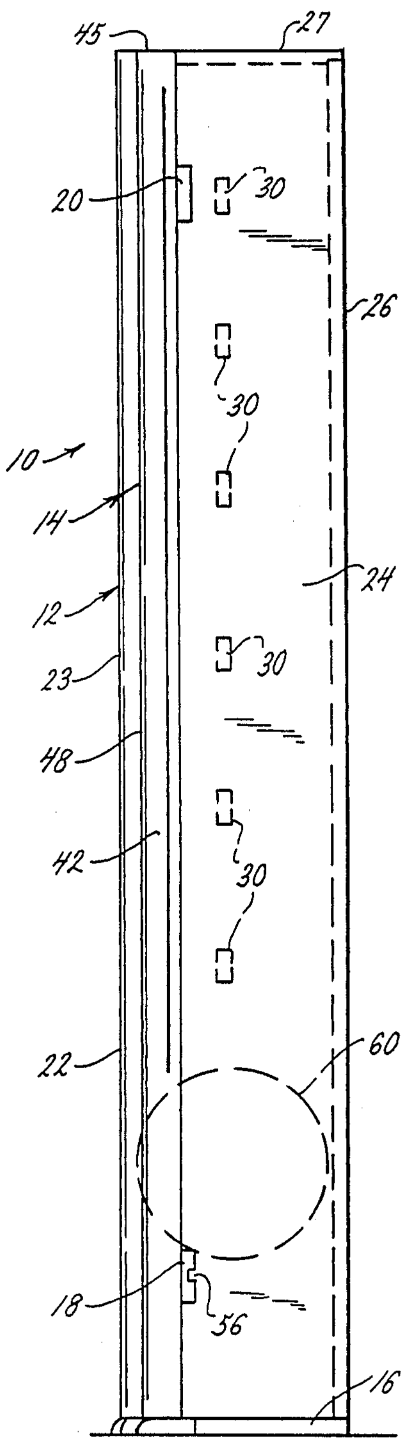
FIG. 2 is a side elevation view of the two column enclosures of the speaker system.

The open line source speaker system 10 of the present invention is shown in FIG. 1. The system comprises a first column speaker mount 12 and a second column speaker mount 14. Both face forward. The first and second column mounts are positioned at a predetermined distance from each other by a base portion 16 and first and second rigid spacing elements 18, 20. Typically they are spaced about 11⅜" apart center-to-center of the speakers. Both the first and second column mounts extend to a vertical height of about 6 feet from the base portion 16 in the preferred embodiment, but the height could range from about 5½ feet to a ceiling height of about 12 feet comprising several separate stacked modules for commercial applications.

Figure 3:
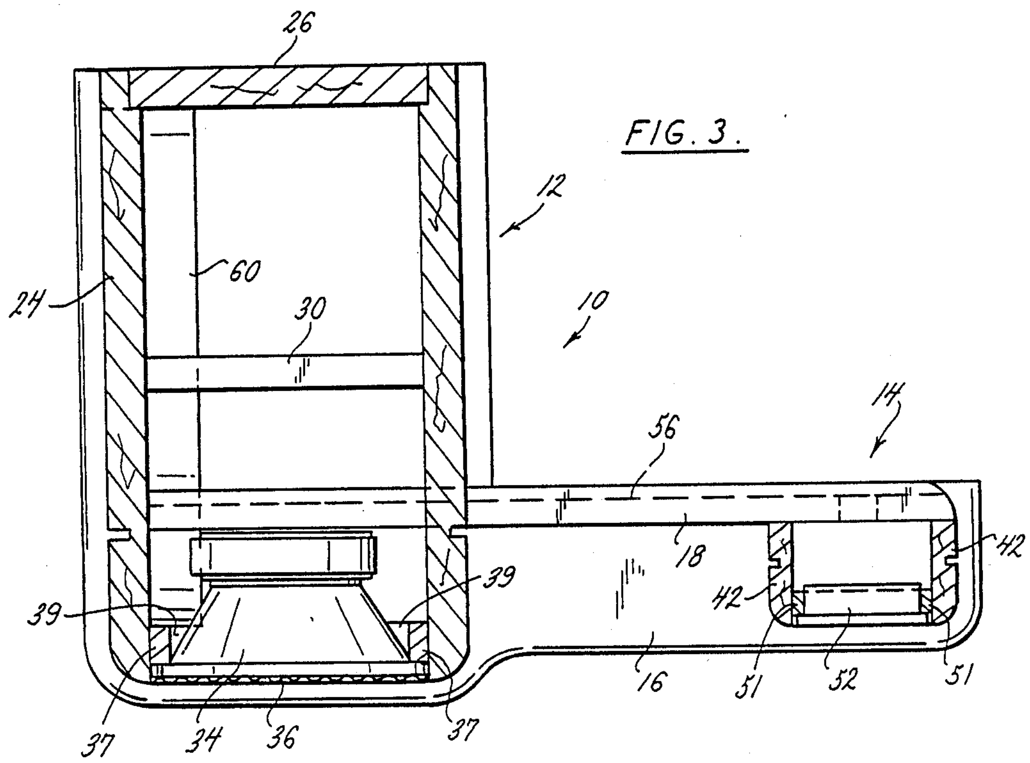
FIG. 3 is a segmented plan view of the column enclosures taken along line 3—3 of FIG. 1.

The first column 12 of the speaker system has a rectangular, box-like configuration, typically about 1'×7"×6', including the axial front face 22, a pair of opposing sides 24, and a back 26. The bottom and top of the mount are closed off by the base portion 16 and a top 27, respectively. The front, sides, the back, and the top and bottom columns are joined together as shown in FIG. 3 to form an enclosed mount that may be of wood or any other workable material. A series of six supports 30 extend between the two sides 24 of the enclosure to provide additional support and rigidity to the enclosure.

In the present example, six identical midrange or woofer speakers 34 are mounted in the face of the enclosure. A fabric or metal grid cover 36 is positioned in the front of the mount covering the six speakers 34.

Figure 4:
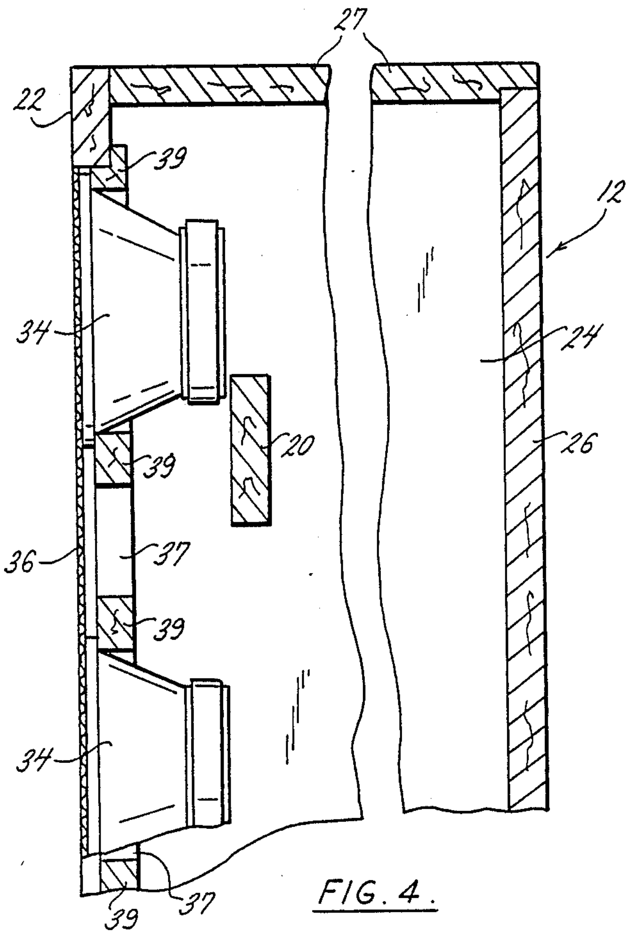
FIG. 4 is a segmented side elevation view of one of the column speaker enclosures taken along the line 4—4 of FIG. 1.

The objective of this invention is to minimize the "box-sound" effect of the system. The "box sound" is not caused by the speaker support or lack of it, but rather a speaker baffle and enclosure that lends itself to early reflections, standing waves and phantom drivers by presenting too much surface area or objects protruding in front of the drivers. To this end, the woofers 34 are supported as shown particularly in FIGS. 3 and 4 by vertical strips 37 extending up the two sides of the mount and engaging the rims of the speakers as shown in FIG. 3. Also, there are transverse members 39 secured to the vertical members 37 and engaging the top and the bottoms of the respective speakers 34.

As can be seen in FIG. 1, the lowermost of the six speakers 34 is positioned close to floor level in the embodiment shown, and the uppermost of the six speakers 34 is positioned at a height above the listener's head, at least about five and one-half feet above the base 16 of the speaker system in the embodiment shown. The remaining speakers 34 are spacially arranged in a vertical line between the upper and lower speakers. Although not shown, the speakers could be arranged to extend from the floor to the ceiling of the listening area. The important thing is that they produce a large listening area that extends from close to floor level to well above the listener's head. The six speakers 34 of the first column 12 are all interconnected by a crossover network (not shown) in a series parallel arrangement with each adjacent pair of speakers being connected in series and the three pairs connected in parallel.

The volume 28 of the first column mount provides ample room for the addition of a sub-bass radiator on the first column should one be desired.

The second column mount 14 of the speaker system of the present invention has a pair of opposed sides 42 which are connected by the base portion 16 and a top 45, respectively. In this example, six identical tweeter speakers 52 are mounted in the second column.

Figure 5:
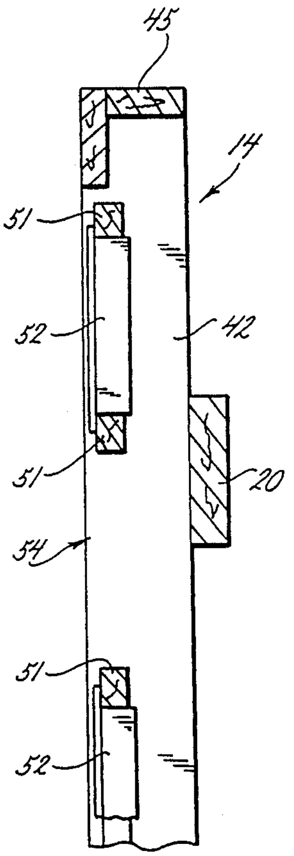
FIG. 5 is a segmented side elevation view of one of the column speaker enclosures taken along the line 5—5 of FIG. 1.

The tweeters 52 are all mounted as shown particularly in FIGS. 3 and 5 in a manner to minimize baffles. Each of the tweeters 52 is mounted in a hole 50 in a square block member 51. The block members are mounted between the two opposed sides 42 of the column 14. The area 54 between the block members 51 on the face of the column is left open to avoid secondary sound wave reflections. There is no back to this column in the area of the tweeters. Both of the two columns minimize the baffle effect. This is particularly true of the tweeter column. All surfaces which could cause reflections are covered with absorbent materials. The inner surface of the opposed sides 42, the surface of the brace 20 facing the tweeters, and the face surface of the block members 51 are all covered with felt to absorb sound waves and prevent their reflection. The tweeters 52 have felt rings 53 on their faces to minimize secondary sound wave reflections off the tweeter chassis.

The tweeters 52 are vertically spaced in the second column 14 to line up horizontally with the woofers 34 in the first column 12. A metal grid or fabric cover (not shown) is fit into the front 48 of the mount to cover the tweeters 52. The six tweeters 52 of the second mount 14 are all interconnected by a crossover network (not shown) in a manner consistent with that known in the art.

A groove 56 is provided in the lower spacing element 18. The tweeter speakers 52 of the second enclosure 14 are connected in series-parallel relation as are the woofers, and communicate with the woofer speakers 34 of the first enclosure 12 by a crossover network (not shown) extending between the two enclosures through the grooves 56. The crossover network extending between the two sets of speakers is provided in a manner consistent with that known in the prior art. The crossover network includes a switch that allows the user to change the crossover points of either the midrange or woofer column or the tweeter column, or both. This changes the frequency balance of the system for differences in the equipment of the system (such as amplifiers, etc.) and the sound source material itself.

Both the first and second columns 12, 14 are fixed at their bottoms to the base portion 16. The first and second columns are positioned side by side with a predetermined distance between the columns maintained by the spacing elements 18, 20 interconnecting the columns. The face portion 48 of the second column 14 is also set back a predetermined distance from the face portion 23 of the first column 12. This spacing is designed to put the voice coils of the tweeters and the midrange or woofers in line. The predetermined distance between the two columns provides the required spacing between the two vertical arrays of midrange or woofer and tweeter speakers to produce sound waves from the two arrays of speakers that are in a correct time and phase response relation.

The mounting of the speakers on the columns as set forth above minimizes the presence of portions of the mounts projecting into the path of sound waves emitted from the speakers or causing early reflections of the primary sound waves. In addition, the columns are made as narrow as possible to minimize the front surface area of the columns in the plane of the speakers that could act as baffles and reflect the sound waves from the speakers. This enables the enclosures to operate as a true source of uncolored sound through all frequencies of sound produced.

Although only one open line source speaker system has been described, it will be apparent to those skilled in the art that at least two source speaker systems are required to produce a stereo sound image. The second source is the mirror image of the first.

The present design of the open-line source operates as a true line source through all frequencies of music by generating all frequencies, including the lowest bass notes, from the top to the bottom of the speaker. All instruments, including bass instruments, are correctly positioned in height as well as width. A kick drum, for example, may appear to emerge from the base of the speaker, a foot off the ground or half-way up the wall, depending upon the recording technique used. The midrange and treble ranges are vertically positioned from the top to the bottom of the speaker as well. The sounds of voices produced tend to position themselves at a realistic distance from the floor, and percussion sounds may appear at knee height or five feet off the floor, depending on the recording technique used. This system differentiates instruments and more accurately positions bass instruments and fundamental frequencies in correct vertical space.

The separate tweeter column from the midrange or woofers column has proved to be a way to provide uncolored sound, correct phase response, and time domain in a line source design. This is particularly true where there is a minimum of baffling in the woofer column and no baffling to speak of in the very narrow tweeter column. Especially is it true where the woofer column is as narrow as possible, and deep enough to allow sufficient internal volume for good bass performance that extends to the lowest bass fundamentals.

The tweeters provide the upper midrange and upper harmonic signature of all instruments. An accurate speaker must have correct tonal balance, phasing and time coherence, particularly in the high frequency range. The present open-line source design achieves this goal.

The combination of increased vertical height, minimal baffles, time alignment and generating the full range of sound through all frequencies from the top to the bottom of the speaker enables the speaker of the present invention to create a more realistic and accurate reproduction of sound that gives the listener the impression of a live performance spread across a soundstage of impressive height.

Working in tandem, the midrange or woofer and tweeter columns provide an exact image placement both in the vertical and horizontal planes. Sounds that are recorded center stage, regardless of instrument, are in fact dead center between the speakers. Illusion of width and depth are outstanding without the tricks needed with other speakers. The arrangement is capable of projecting a wall-to-wall image and solid placement of instruments. And the speakers' high efficiency produces a presence forward of the speaker unmatched in the industry.

The arrangement has a sweet spot far wider than other speakers in its class. It has good stereo imaging from all over the front plane of the listening room. The vertical placement allows for correct vertical height through a broader range of listener positions—including the standing position. A person standing in the listening room will still get a good sense of vertical placement of instruments.

The physical depth of the speakers also allows for the placement of the sub-bass radiator 60 in the sides of the system. A ten-inch or larger passive radiator may be placed at the top or bottom or both for improved sub-bass output.

While the present invention has been described by reference to a specific embodiment, it should be understood that modifications and variations of the invention may be constructed without departing from the scope of the invention defined in the following claims.

What is claimed is:

1. A loudspeaker system comprising:

a first vertical loudspeaker housing having a front, means mounting a first plurality of loudspeakers in a vertical column on the front of the first housing, the first plurality of loudspeakers including an uppermost loudspeaker and a lowermost loudspeaker in the column, the uppermost loudspeaker being at least four and one-half feet above the lowermost loudspeaker;

a second vertical loudspeaker housing having a front, the first and second housings being substantially equal in height, and means mounting a second plurality of loudspeakers in a vertical column on the front of the second housing, the second plurality of loudspeakers being equal in number to the first plurality of loudspeakers; and spacer means connected between the first loudspeaker housing and the second loudspeaker housing, to maintain the first and second loudspeaker housings spaced apart by a predetermined distance.

2. The loudspeaker system of claim 1 comprising:

the spacer means connected between the first loudspeaker housing and the second loudspeaker housing fixing the front of the first housing stationary and at a desired orientation relative to the front of the second housing.

3. The loudspeaker system of claim 1 comprising:

the first plurality of loudspeakers mounted on the front of the first housing being arranged in a single vertical line; and the second plurality of loudspeakers mounted on the front of the second housing being arranged in a single vertical line.

4. The loudspeaker system of claim 1 comprising:

the loudspeakers mounted on the front of the first housing being adapted to produce sounds in a first range of sound frequencies, and the loudspeakers mounted on the front of the second housing being adapted to produce sounds in a second range of sound frequencies substantially different from the first range of sound frequencies.

5. The loudspeaker system of claim 4 comprising:

the loudspeakers mounted on the front of one of the housings being tweeters, and the loudspeakers mounted on the front of the other of the housings being midrange loudspeakers.

6. The loudspeaker system such as claim 1 comprising:

first means arranged to supply electric signals to each loudspeaker of the first plurality of loudspeakers in the first housing, each loudspeaker of the first plurality of loudspeakers being adapted to produce sounds in a high frequency range in response to said electric signals; and said first means being arranged to supply said electric signals to each loudspeaker of the second plurality of loudspeakers in the second housing, each loudspeaker of the second plurality of loudspeakers being adapted to produce sounds in a low frequency range in response to said electric signals;

whereby the first and second plurality of loudspeakers produce a total range of sounds in both high and low frequencies throughout the vertical alignment of the loudspeakers, and the total range of sounds produced is perceived by a listener at various vertical heights between an uppermost loudspeaker and a lowermost loudspeaker of each of the first and second pluralities of loudspeakers, giving the listener a full range of sound frequencies in both horizontal and vertical planes.

7. The loudspeaker system of claim 1 comprising:

the spacer means connected between the first loudspeaker housing and the second loudspeaker housing being arranged to maintain a fixed predetermined spaced distance between the loudspeakers mounted on the front of the first housing and the loudspeakers mounted on the front of the second housing.

8. The loudspeaker system of claim 1 comprising:

the first plurality of loudspeakers mounted on the front of the first housing being equal in number to the second plurality of loudspeakers mounted on the front of the second housing.

9. The loudspeaker system of claim 1 comprising:

each of the loudspeakers mounted on the front of the first housing being horizontally aligned with one of the loudspeakers mounted on the front surface of the second housing.

10. The loudspeaker system comprising:

a first loudspeaker housing having a front vertical surface, and a first plurality of loudspeakers mounted vertically on the front surface of the first housing;

a second loudspeaker housing separated from the first loudspeaker housing by a predetermined spaced distance and having a front vertical surface, and a second plurality of loudspeakers mounted vertically on the front surface of the second housing;

signal supply means arranged to supply electric signals to each loudspeaker of both the first and second pluralities of loudspeakers;

each loudspeaker mounted on the front surface of the first housing being adapted to produce sounds in a first range of sound frequencies in response to said electric signals supplied from the signal supply means; and each loudspeaker mounted on the front surface of the second housing being adapted to produce sounds in a second range of sound frequencies, substantially different from the first range of sound frequencies, in response to said electric signals supplied from the signal supply means.

11. The loudspeaker system of claim 10 comprising:

each loudspeaker of the first plurality of loudspeakers being a midrange speaker; and each loudspeaker of the second plurality of loudspeakers being a tweeter.

12. The loudspeaker system of claim 10 comprising:

at least one spacer element connected between the first housing and the second housing, the spacer element maintaining the predetermined spaced distance separating the first and second housings.

13. The loudspeaker system of claim 10 comprising:

spacer means connected between the first loudspeaker housing and the second loudspeaker housing, the spacer means being arranged to maintain a predetermined spaced distance between the first plurality of loudspeakers mounted on the front surface of the first housing and the second plurality of loudspeakers mounted on the front surface of the second housing.

14. The loudspeaker system of claim 10 comprising:

spacer means connected between the first loudspeaker housing and the second loudspeaker housing, the spacer means being arranged to fix the front surface of the first housing stationary and at a predetermined orientation relative to the front surface of the second housing.

15. The loudspeaker system of claim 10 comprising:

each of the first plurality of loudspeakers mounted on the front surface of the first housing being horizontally aligned with one of the second plurality of loudspeakers mounted on the front surface of the second housing.

16. A loudspeaker system comprising:

a loudspeaker housing having a bottom member, a top member, a left sidewall, and a right sidewall;

the left and right sidewall being connected between the top and bottom members of the housing in spaced, mutually opposed positions, the spacing of the sidewalls defining an open front and an open back of the housing;

a plurality of loudspeakers, each having a front and a back; and means mounting the plurality of loudspeakers in the open front of the housing with the front of each loudspeaker facing in a first direction, and the back of each loudspeaker being exposed through the open back of the housing.

17. The loudspeaker system of claim 16 comprising: the means mounting the plurality of loudspeakers in the open front of the housing dividing the housing open front into several separate segments, with some of the segments of the open front being covered by the mounting means, and adjacent covered segments of the open front being spaced apart and separated by open segments of the open front.

18. The loudspeaker system of claim 16 comprising: the means mounting the plurality of loudspeakers in the open front of the housing arranging the plurality of loudspeakers spatially in a single vertical line, with portions of the open front of the housing separating adjacent loudspeakers.

19. The loudspeaker system of claim 16 comprising: the plurality of loudspeakers being substantially identical tweeter loudspeakers.

20. The loudspeaker system of claim 16 comprising: the plurality of loudspeakers being mounted in the open front of the housing in a single vertical line with an uppermost one of the plurality of loudspeakers being mounted at least four and one-half feet above a lowermost one of the plurality of loudspeakers.

21. The loudspeaker system of claim 16 comprising: each loudspeaker of the plurality of loudspeakers being adapted to produce sounds in a substantially identical limited range of sound frequencies.

22. The loudspeaker system of claim 16 comprising: the mounting means including a plurality of horizontal members connected between the opposed sidewalls of the housing, the horizontal members being vertically spaced in the open front of the housing.

* * * * *